(12) United States Patent
Fallon et al.

(10) Patent No.: US 7,386,046 B2
(45) Date of Patent: Jun. 10, 2008

(54) BANDWIDTH SENSITIVE DATA COMPRESSION AND DECOMPRESSION

(75) Inventors: James J. Fallon, Armonk, NY (US); Stephen J. McErlain, New York, NY (US)

(73) Assignee: Realtime Data LLC, New York, NY (US)

(*) Notice: Subject to any disclaimer, the term of this patent is extended or adjusted under 35 U.S.C. 154(b) by 415 days.

(21) Appl. No.: 10/076,013

(22) Filed: Feb. 13, 2002

(65) Prior Publication Data

US 2002/0191692 A1    Dec. 19, 2002

Related U.S. Application Data

(60) Provisional application No. 60/268,394, filed on Feb. 13, 2001.

(51) Int. Cl.
*H04B 1/66* (2006.01)

(52) U.S. Cl. .................................................. 375/240
(58) Field of Classification Search ............... 375/240, 375/222, 372, 377; 348/384; 704/501, 502
See application file for complete search history.

(56) References Cited

U.S. PATENT DOCUMENTS

| | | | |
|---|---|---|---|
| 4,127,518 A | 11/1978 | Coy et al. | |
| 4,302,775 A | 11/1981 | Widergren et al. | |
| 4,394,774 A | 7/1983 | Widergren et al. | |
| 4,574,351 A | 3/1986 | Dang et al. | |
| 4,593,324 A | 6/1986 | Ohkubo et al. | |
| 4,682,150 A | 7/1987 | Mathes et al. | |
| 4,730,348 A | 3/1988 | MacCrisken | |
| 4,754,351 A | 6/1988 | Wright | |
| 4,804,959 A | 2/1989 | Makansi et al. | |
| 4,870,415 A | 9/1989 | Van Maren et al. | |
| 4,872,009 A | 10/1989 | Tsukiyama et al. | |
| 4,876,541 A | 10/1989 | Storer | |
| 4,888,812 A * | 12/1989 | Dinan et al. ................ 382/140 |
| 4,906,995 A | 3/1990 | Swanson | |
| 4,929,946 A * | 5/1990 | O'Brien et al. ............... 341/87 |
| 4,953,324 A | 9/1990 | Herrmann | |
| 4,965,675 A | 10/1990 | Hori et al. | |
| 4,988,998 A | 1/1991 | O'Brien | |

(Continued)

FOREIGN PATENT DOCUMENTS

DE    4127518    2/1992

(Continued)

OTHER PUBLICATIONS

Rice, Robert F., "Some Practical Universal Noiseless Coding Techniques", Jet Propulsion Laboratory, Pasadena, California, JPL Publication 79-22, Mar. 15, 1979.

(Continued)

*Primary Examiner*—Tesfaldet Bocure
(74) *Attorney, Agent, or Firm*—Ropes & Gray LLP

(57) ABSTRACT

Data compression and decompression methods for compressing and decompressing data based on an actual or expected throughput (bandwidth) of a system. In one embodiment, a controller tracks and monitors the throughput (data storage and retrieval) of a data compression system and generates control signals to enable/disable different compression algorithms when, e.g., a bottleneck occurs so as to increase the throughput and eliminate the bottleneck.

41 Claims, 4 Drawing Sheets

U.S. PATENT DOCUMENTS

| | | | |
|---|---|---|---|
| 5,028,922 A | 7/1991 | Huang | |
| 5,045,848 A | 9/1991 | Fascenda | |
| 5,045,852 A | 9/1991 | Mitchell et al. | |
| 5,046,027 A | 9/1991 | Taaffe et al. | |
| 5,049,881 A | 9/1991 | Gibson et al. | |
| 5,091,782 A | 2/1992 | Krause et al. | |
| 5,097,261 A | 3/1992 | Langdon, Jr. et al. | |
| 5,113,522 A | 5/1992 | Dinwiddie, Jr. et al. | |
| 5,121,342 A | 6/1992 | Szymborski | |
| 5,150,430 A | 9/1992 | Chu | |
| 5,159,336 A * | 10/1992 | Rabin et al. | 341/51 |
| 5,175,543 A | 12/1992 | Lantz | |
| 5,179,651 A | 1/1993 | Taaffe et al. | |
| 5,187,793 A | 2/1993 | Keith et al. | |
| 5,191,431 A * | 3/1993 | Hasegawa et al. | 386/109 |
| 5,204,756 A | 4/1993 | Chevion et al. | |
| 5,209,220 A | 5/1993 | Hiyama et al. | |
| 5,212,742 A | 5/1993 | Normile et al. | |
| 5,226,176 A | 7/1993 | Westaway et al. | |
| 5,227,893 A | 7/1993 | Ett | |
| 5,231,492 A | 7/1993 | Dangi et al. | |
| 5,237,460 A | 8/1993 | Miller et al. | |
| 5,237,675 A | 8/1993 | Hannon, Jr. | |
| 5,243,341 A | 9/1993 | Seroussi et al. | |
| 5,243,348 A | 9/1993 | Jackson | |
| 5,247,638 A | 9/1993 | O'Brien et al. | |
| 5,247,646 A | 9/1993 | Osterlund et al. | |
| 5,263,168 A | 11/1993 | Toms et al. | |
| 5,270,832 A | 12/1993 | Balkanski et al. | |
| 5,287,420 A | 2/1994 | Barrett | |
| 5,293,379 A | 3/1994 | Carr | |
| 5,307,497 A | 4/1994 | Feigenbaum et al. | |
| 5,309,555 A | 5/1994 | Akins et al. | |
| 5,355,498 A | 10/1994 | Provino et al. | |
| 5,357,614 A | 10/1994 | Pattisam et al. | |
| 5,379,036 A | 1/1995 | Storer | |
| 5,379,757 A | 1/1995 | Hiyama et al. | |
| 5,381,145 A | 1/1995 | Allen et al. | |
| 5,394,534 A | 2/1995 | Kulakowski et al. | |
| 5,396,228 A | 3/1995 | Garahi | |
| 5,400,401 A | 3/1995 | Wasilewski et al. | |
| 5,403,639 A | 4/1995 | Belsan et al. | |
| 5,406,278 A | 4/1995 | Graybill et al. | |
| 5,406,279 A | 4/1995 | Anderson et al. | |
| 5,412,384 A | 5/1995 | Chang et al. | |
| 5,414,850 A | 5/1995 | Whiting | |
| 5,420,639 A | 5/1995 | Perkins | |
| 5,434,983 A | 7/1995 | Yaso et al. | |
| 5,452,287 A | 9/1995 | Dicecco | |
| 5,461,679 A | 10/1995 | Normile et al. | |
| 5,467,087 A | 11/1995 | Chu | |
| 5,471,206 A | 11/1995 | Allen et al. | |
| 5,479,587 A | 12/1995 | Campbell et al. | |
| 5,483,470 A | 1/1996 | Alur et al. | |
| 5,486,826 A | 1/1996 | Remillard | |
| 5,495,244 A | 2/1996 | Jeong et al. | |
| 5,506,844 A | 4/1996 | Rao | |
| 5,506,872 A | 4/1996 | Mohler | |
| 5,530,845 A | 6/1996 | Hiatt et al. | |
| 5,533,051 A | 7/1996 | James | |
| 5,535,356 A | 7/1996 | Kim et al. | |
| 5,537,658 A | 7/1996 | Bakke et al. | |
| 5,557,551 A * | 9/1996 | Craft | 702/130 |
| 5,557,668 A | 9/1996 | Brady | |
| 5,557,749 A | 9/1996 | Norris | |
| 5,561,824 A | 10/1996 | Carreiro et al. | |
| 5,563,961 A * | 10/1996 | Rynderman et al. | 382/239 |
| 5,574,952 A | 11/1996 | Brady et al. | |
| 5,574,953 A | 11/1996 | Rust et al. | |
| 5,576,953 A | 11/1996 | Hugentobler | |
| 5,583,500 A | 12/1996 | Allen et al. | |
| 5,590,306 A | 12/1996 | Watanabe et al. | |
| 5,596,674 A | 1/1997 | Bhandari et al. | |
| 5,604,824 A | 2/1997 | Chui et al. | |
| 5,606,706 A | 2/1997 | Takamoto et al. | |
| 5,611,024 A | 3/1997 | Campbell et al. | |
| 5,612,788 A | 3/1997 | Stone | |
| 5,613,069 A | 3/1997 | Walker | |
| 5,615,017 A | 3/1997 | Choi | |
| 5,621,820 A | 4/1997 | Rynderman et al. | |
| 5,623,623 A | 4/1997 | Kim et al. | |
| 5,623,701 A | 4/1997 | Bakke et al. | |
| 5,627,534 A | 5/1997 | Craft | |
| 5,627,995 A | 5/1997 | Miller et al. | |
| 5,629,732 A | 5/1997 | Moskowitz et al. | |
| 5,630,092 A | 5/1997 | Carreiro et al. | |
| 5,635,632 A | 6/1997 | Fay et al. | |
| 5,635,932 A | 6/1997 | Shinagawa et al. | |
| 5,638,498 A * | 6/1997 | Tyler et al. | 358/1.18 |
| 5,640,158 A | 6/1997 | Okayama et al. | |
| 5,642,506 A | 6/1997 | Lee | |
| 5,649,032 A | 7/1997 | Burt et al. | |
| 5,652,795 A | 7/1997 | Dillon et al. | |
| 5,652,857 A | 7/1997 | Shimoi et al. | |
| 5,652,917 A | 7/1997 | Maupin et al. | |
| 5,654,703 A | 8/1997 | Clark, II | |
| 5,655,138 A | 8/1997 | Kikinis | |
| 5,666,560 A | 9/1997 | Moertl et al. | |
| 5,668,737 A | 9/1997 | Iler | |
| 5,671,389 A | 9/1997 | Saliba | |
| 5,675,333 A * | 10/1997 | Boursier et al. | 341/87 |
| 5,686,916 A | 11/1997 | Bakhmutsky | |
| 5,694,619 A | 12/1997 | Konno | |
| 5,696,927 A | 12/1997 | MacDonald et al. | |
| 5,703,793 A | 12/1997 | Wise et al. | |
| 5,715,477 A | 2/1998 | Kikinis | |
| 5,717,393 A | 2/1998 | Nakano et al. | |
| 5,717,394 A | 2/1998 | Schwartz et al. | |
| 5,719,862 A | 2/1998 | Lee et al. | |
| 5,721,958 A | 2/1998 | Kikinis | |
| 5,724,475 A | 3/1998 | Kirsten | |
| 5,729,228 A | 3/1998 | Franaszek et al. | |
| 5,748,904 A | 5/1998 | Huang et al. | |
| 5,757,852 A | 5/1998 | Jericevic et al. | |
| 5,771,340 A | 6/1998 | Nakazato et al. | |
| 5,778,411 A | 7/1998 | DeMoss et al. | |
| 5,781,767 A | 7/1998 | Inoue et al. | |
| 5,784,572 A | 7/1998 | Rostoker et al. | |
| 5,787,487 A | 7/1998 | Hashimoto et al. | |
| 5,796,864 A | 8/1998 | Callahan | |
| 5,799,110 A | 8/1998 | Israelsen et al. | |
| 5,805,932 A | 9/1998 | Kawashima et al. | |
| 5,808,660 A | 9/1998 | Sekine et al. | |
| 5,809,176 A | 9/1998 | Yajima | |
| 5,809,337 A | 9/1998 | Hannah et al. | |
| 5,812,789 A | 9/1998 | Diaz et al. | |
| 5,818,368 A | 10/1998 | Langley | |
| 5,818,369 A | 10/1998 | Withers | |
| 5,818,530 A | 10/1998 | Canfield et al. | |
| 5,819,215 A | 10/1998 | Dobson et al. | |
| 5,825,424 A | 10/1998 | Canfield et al. | |
| 5,825,830 A | 10/1998 | Kopf | |
| 5,832,037 A | 11/1998 | Park | |
| 5,832,126 A | 11/1998 | Tanaka | |
| 5,836,003 A | 11/1998 | Sadeh | |
| 5,838,996 A | 11/1998 | deCarmo | |
| 5,839,100 A | 11/1998 | Wegener | |
| 5,841,979 A | 11/1998 | Schulhof et al. | |
| 5,847,762 A | 12/1998 | Canfield | |
| 5,861,824 A | 1/1999 | Ryu et al. | |
| 5,861,920 A | 1/1999 | Mead et al. | |
| 5,864,342 A | 1/1999 | Kajiya et al. | |
| 5,867,167 A | 2/1999 | Deering | |
| 5,867,602 A | 2/1999 | Zandi et al. | |

| | | | | | | |
|---|---|---|---|---|---|---|
| 5,870,036 | A | 2/1999 | Franaszek et al. | 6,487,640 B1 * | 11/2002 | Lipasti ............... 711/140 |
| 5,870,087 | A | 2/1999 | Chau | 6,489,902 B2 | 12/2002 | Heath |
| 5,872,530 | A | 2/1999 | Domyo et al. | 6,513,113 B1 | 1/2003 | Kobayashi |
| 5,883,975 | A | 3/1999 | Narita et al. | 6,529,633 B1 | 3/2003 | Easwar et al. |
| 5,886,655 | A | 3/1999 | Rust | 6,532,121 B1 | 3/2003 | Rust et al. |
| 5,889,961 | A | 3/1999 | Dobbek | 6,539,456 B2 | 3/2003 | Stewart |
| 5,915,079 | A | 6/1999 | Vondran, Jr. et al. | 6,542,644 B1 | 4/2003 | Satoh |
| 5,917,438 | A | 6/1999 | Ando | 6,577,254 B2 | 6/2003 | Rasmussen |
| 5,920,326 | A | 7/1999 | Rentschler et al. | 6,590,609 B1 | 7/2003 | Kitade et al. |
| 5,936,616 | A | 8/1999 | Torborg, Jr. et al. | 6,597,812 B1 | 7/2003 | Fallon et al. |
| 5,949,355 | A | 9/1999 | Panaoussis | 6,601,104 B1 * | 7/2003 | Fallon ............... 709/231 |
| 5,955,976 | A | 9/1999 | Heath | 6,604,040 B2 | 8/2003 | Kawasaki et al. |
| 5,960,465 | A | 9/1999 | Adams | 6,604,158 B1 | 8/2003 | Fallon |
| 5,964,842 | A | 10/1999 | Packard | 6,606,040 B2 | 8/2003 | Abdat |
| 5,968,149 | A | 10/1999 | Jaquette et al. | 6,606,413 B1 | 8/2003 | Zeineh |
| 5,973,630 | A | 10/1999 | Heath | 6,609,223 B1 | 8/2003 | Wolfgang |
| 5,974,235 | A * | 10/1999 | Nunally et al. ............ 709/202 | 6,618,728 B1 | 9/2003 | Rail |
| 5,974,471 | A | 10/1999 | Belt | 6,624,761 B2 | 9/2003 | Fallon |
| 5,978,483 | A | 11/1999 | Thompson, Jr. et al. | 6,650,261 B2 | 11/2003 | Nelson et al. |
| 5,982,723 | A * | 11/1999 | Kamatani ................ 369/47.3 | 6,661,839 B1 | 12/2003 | Ishida et al. |
| 5,991,515 | A | 11/1999 | Fall et al. | 6,661,845 B1 | 12/2003 | Herath |
| 5,996,033 | A | 11/1999 | Chiu-Hao | 6,704,840 B2 | 3/2004 | Nalawadi et al. |
| 6,000,009 | A | 12/1999 | Brady | 6,711,709 B1 | 3/2004 | York |
| 6,002,411 | A | 12/1999 | Dye | 6,717,534 B2 | 4/2004 | Yokose |
| 6,003,115 | A | 12/1999 | Spear et al. | 6,731,814 B2 | 5/2004 | Zeck et al. |
| 6,008,743 | A | 12/1999 | Jaquette | 6,745,282 B2 | 6/2004 | Okada et al. |
| 6,011,901 | A | 1/2000 | Kirsten | 6,748,457 B2 * | 6/2004 | Fallon et al. ............... 710/2 |
| 6,014,694 | A | 1/2000 | Aharoni et al. | 6,756,922 B2 | 6/2004 | Ossia |
| 6,026,217 | A | 2/2000 | Adiletta | 6,810,434 B2 | 10/2004 | Muthujumaraswathy et al. |
| 6,028,725 | A | 2/2000 | Blumenau | 6,856,651 B2 | 2/2005 | Singh |
| 6,031,939 | A | 2/2000 | Gilbert et al. | 6,885,316 B2 | 4/2005 | Mehring |
| 6,032,148 | A | 2/2000 | Wilkes | 6,885,319 B2 | 4/2005 | Geiger et al. |
| 6,061,398 | A | 5/2000 | Satoh et al. | 6,888,893 B2 | 5/2005 | Li et al. |
| 6,073,232 | A | 6/2000 | Kroeker et al. | 6,909,383 B2 | 6/2005 | Shokrollahi et al. |
| 6,075,470 | A | 6/2000 | Little et al. | 6,944,740 B2 | 9/2005 | Abali et al. |
| 6,091,777 | A | 7/2000 | Guetz et al. | 7,054,493 B2 | 5/2006 | Schwartz |
| 6,094,634 | A | 7/2000 | Yahagi et al. | 7,102,544 B1 | 9/2006 | Liu |
| 6,097,520 | A * | 8/2000 | Kadnier ............... 398/106 | 7,130,913 B2 | 10/2006 | Fallon |
| 6,104,389 | A * | 8/2000 | Ando ............... 725/39 | 7,161,506 B2 | 1/2007 | Fallon |
| 6,105,130 | A | 8/2000 | Wu et al. | 7,181,608 B2 | 2/2007 | Fallon et al. |
| 6,128,412 | A | 10/2000 | Satoh | 7,190,284 B1 | 3/2007 | Dye et al. |
| 6,141,053 | A | 10/2000 | Saukkonen | 7,321,937 B2 | 1/2008 | Fallon |
| 6,145,069 | A | 11/2000 | Dye | 2001/0031092 A1 | 10/2001 | Zeck et al. |
| 6,169,241 | B1 | 1/2001 | Shimizu | 2001/0032128 A1 | 10/2001 | Kepecs |
| 6,172,936 | B1 | 1/2001 | Kitazaki | 2001/0052038 A1 | 12/2001 | Fallon et al. |
| 6,173,381 | B1 | 1/2001 | Dye | 2002/0037035 A1 | 3/2002 | Singh |
| 6,182,125 | B1 | 1/2001 | Borella et al. | 2002/0080871 A1 | 6/2002 | Fallon et al. |
| 6,192,082 | B1 | 2/2001 | Moriarty et al. | 2002/0101367 A1 | 8/2002 | Geiger et al. |
| 6,195,024 | B1 | 2/2001 | Fallon | 2002/0104891 A1 | 8/2002 | Otto |
| 6,195,465 | B1 | 2/2001 | Zandi et al. | 2002/0126755 A1 | 9/2002 | Li et al. |
| 6,222,886 | B1 | 4/2001 | Yogeshwar | 2003/0030575 A1 | 2/2003 | Frachtenberg et al. |
| 6,225,922 | B1 | 5/2001 | Norton | 2003/0034905 A1 | 2/2003 | Anton et al. |
| 6,226,667 | B1 | 5/2001 | Matthews et al. | 2003/0084238 A1 | 5/2003 | Okata et al. |
| 6,226,740 | B1 | 5/2001 | Iga | 2003/0142874 A1 | 7/2003 | Schwartz |
| 6,253,264 | B1 | 6/2001 | Sebastian | 2003/0191876 A1 | 10/2003 | Fallon |
| 6,272,178 | B1 | 8/2001 | Nieweglowski et al. | 2004/0042506 A1 | 3/2004 | Fallon et al. |
| 6,272,627 | B1 | 8/2001 | Mann | 2004/0073710 A1 | 4/2004 | Fallon |
| 6,272,628 | B1 | 8/2001 | Aguilar et al. | 2006/0015650 A1 | 1/2006 | Fallon |
| 6,282,641 | B1 | 8/2001 | Christensen | 2006/0181441 A1 | 8/2006 | Fallon |
| 6,308,311 | B1 | 10/2001 | Carmichael et al. | 2006/0181442 A1 | 8/2006 | Fallon |
| 6,309,424 | B1 | 10/2001 | Fallon | 2006/0184696 A1 | 8/2006 | Fallon |
| 6,317,714 | B1 | 11/2001 | Del Castillo et al. | 2006/0190644 A1 | 8/2006 | Fallon |
| 6,330,622 | B1 | 12/2001 | Schaefer | 2006/0195601 A1 | 8/2006 | Fallon |
| 6,345,307 | B1 | 2/2002 | Booth | 2007/0043939 A1 | 2/2007 | Fallon et al. |
| 6,392,567 | B2 | 5/2002 | Satoh | 2007/0050514 A1 | 3/2007 | Fallon |
| 6,404,931 | B1 | 6/2002 | Chen et al. | 2007/0050515 A1 | 3/2007 | Fallon |
| 6,421,387 | B1 | 7/2002 | Rhee | 2007/0067483 A1 | 3/2007 | Fallon |
| 6,434,168 | B1 | 8/2002 | Kari | 2007/0083746 A1 | 4/2007 | Fallon et al. |
| 6,434,695 | B1 | 8/2002 | Esfahani et al. | 2007/0109154 A1 | 5/2007 | Fallon |
| 6,442,659 | B1 | 8/2002 | Blumenau | 2007/0109155 A1 | 5/2007 | Fallon |
| 6,449,682 | B1 | 9/2002 | Toorians | 2007/0109156 A1 | 5/2007 | Fallon |
| 6,452,602 | B1 | 9/2002 | Morein | | | |
| 6,463,509 | B1 | 10/2002 | Teoman et al. | | | |

| | | |
|---|---|---|
| 2007/0174209 | A1 7/2007 | Fallon et al. |

FOREIGN PATENT DOCUMENTS

| | | |
|---|---|---|
| EP | 0185098 | 6/1985 |
| EP | 0164677 | 12/1985 |
| EP | 0283798 | 9/1988 |
| EP | 0405572 | 6/1990 |
| EP | 0493130 | 12/1991 |
| EP | 0587437 A2 * | 3/1994 |
| EP | 0595406 | 5/1994 |
| EP | 0718751 | 6/1996 |
| GB | 2162025 | 1/1986 |
| JP | 6051989 | 2/1994 |
| JP | 9188009 | 1/1996 |
| JP | 11149376 | 6/1999 |
| WO | WO9414273 | 6/1994 |
| WO | WO9429852 | 12/1994 |
| WO | WO9502873 | 1/1995 |
| WO | WO9748212 | 6/1997 |

OTHER PUBLICATIONS

Anderson, J., et al. "Codec squeezes color teleconferencing through digital telephone lines", Electronics 1984, pp. 13-15.

Venbrux, Jack, "A VLSI Chip Set for High-Speed Lossless Data Compression", IEEE Trans. On Circuits and Systems for Video Technology, vol. 2, No. 44, Dec. 1992, pp. 381-391.

"Fast Dos Soft Boot", IBM Technical Disclosure Bulletin, Feb 1994, vol. 37, Issue No. 2B, pp. 185-186.

"Operating System Platform Abstraction Method", IBM Technical Disclosure Bulletin, Feb. 1995, vol. 38, Issue No. 2, pp. 343-344.

Murashita, K., et al., "High-Speed Statistical Compression using Self-organized Rules and Predetermined Code Tables", IEEE, 1996 Data Compression Conference.

Coene, W., et al. "A Fast Route for Application of a Rate-distortion Optimal Quantization in an MPEG Video Encoder" Proceedings of the International Conference on Image Processing, US., New York, Sep. 16, 1996, pp. 825-8286.

Rice, Robert, "Lossless Coding Standards for Space Data Systems", IEEE 1058-6393/97, pp. 577-585.

Yen, Pen-Shu, "The CCSDS Lossless Data Compression Recommendation for Space Applications", Chapter 16, Lossless Compression Handbook, Elsevier Science (USA), 2003, pp. 311-326.3.

Millman, Howard, "Image and video compression", Computerworld, vol. 33, Issue No. 3, Jan. 18, 1999, pp. 78.

"IBM boosts your memory", Geek.com [online], Jun. 26, 2000 [retrieved on Jul. 6, 2007], <URL:http://www.geek.com/ibm-boosts-your-memory/>.

"IBM Research Breakthrough Doubles Computer Memory Capacity", IBM Press Release [online], Jun. 26, 2000 [retrieved on Jul. 6, 2007], <URL:http://www-03.ibm.com/press/us/en/pressrelease/1653.wss>.

"ServerWorks To Deliver IBM's Memory eXpansion Technology in Next-Generation Core Logic Servers", ServerWorks Press Release [online], Jun. 27, 2000 [retrieved on Jul. 14, 2000], <URL:http://www.serverworks.com/news/press/ 000627.html>.

Abali, B., et al., "Memory Expansion Technology (MXT) Software support and performance", IBM Journal of Research and Development, vol. 45, Issue No. 2, Mar. 2001, pp. 287-301.

Franaszek, P. A., et al., "Algorithms and data structures for compressed-memory machines", IBM Journal of Research and Development, vol. 45, Issue No. 2, Mar. 2001, pp. 245-258.

Franaszek, P. A., et al., "On internal organization in compressed random-access memories", IBM Journal of Research and Development, vol. 45, Issue No. 2, Mar. 2001, pp. 259-270.

Smith, T.B., et al., "Memory Expansion Technology (MXT) Competitive impact", IBM Journal of Research and Development, vol. 45, Issue No. 2, Mar. 2001, pp. 303-309.

Tremaine, R. B., et al., "IBM Memory Expansion Technology (MXT)", IBM Journal of Research and Development, vol. 45, Issue No. 2, Mar. 2001, pp. 271-285.

* cited by examiner

SECTOR MAP DEFINITION

| SECTOR MAP | |
|---|---|
| Type | 2 bits |
| C Type | 3 bits |
| C Info | 19 bits |
| Sector Count | 8 bits |
| LBA | 32 bits |

BANDWIDTH SENSITIVE DATA COMPRESSION AND DECOMPRESSION

CROSS-REFERENCE TO RELATED APPLICATION

This application is based on U.S. provisional application Ser. No. 60/268,394, filed on Feb. 13, 2001, which is fully incorporated herein by reference.

BACKGROUND

1. Technical Field

The present invention relates generally to data compression and decompression and, in particular, to a system and method for compressing and decompressing data based on an actual or expected throughput (bandwidth) of a system that employs data compression. Additionally the present invention relates to the subsequent storage, retrieval, and management of information in data storage devices utilizing either compression and/or accelerated data storage and retrieval bandwidth.

2. Description of Related Art

There are a variety of data compression algorithms that are currently available, both well defined and novel. Many compression algorithms define one or more parameters that can be varied, either dynamically or a-priori, to change the performance characteristics of the algorithm. For example, with a typical dictionary based compression algorithm such as Lempel-Ziv, the size of the dictionary can affect the performance of the algorithm. Indeed, a large dictionary may be employed to yield very good compression ratios but the algorithm may take a long time to execute. If speed were more important than compression ratio, then the algorithm can be limited by selecting a smaller dictionary, thereby obtaining a much faster compression time, but at the possible cost of a lower compression ratio. The desired performance of a compression algorithm and the system in which the data compression is employed, will vary depending on the application.

Thus, one challenge in employing data compression for a given application or system is selecting one or more optimal compression algorithms from the variety of available algorithms. Indeed, the desired balance between speed and efficiency is typically a significant factor that is considered in determining which algorithm to employ for a given set of data. Algorithms that compress particularly well usually take longer to execute whereas algorithms that execute quickly usually do not compress particularly well.

Accordingly, a system and method that would provide dynamic modification of compression system parameters so as to provide an optimal balance between execution speed of the algorithm (compression rate) and the resulting compression ratio, is highly desirable.

Yet another problem within the current art is data storage and retrieval bandwidth limitations. Modern computers utilize a hierarchy of memory devices. In order to achieve maximum performance levels, modern processors utilize onboard memory and on board cache to obtain high bandwidth access to both program and data. Limitations in process technologies currently prohibit placing a sufficient quantity of onboard memory for most applications. Thus, in order to offer sufficient memory for the operating system(s), application programs, and user data, computers often use various forms of popular off-processor high speed memory including static random access memory (SRAM), synchronous dynamic random access memory (SDRAM), synchronous burst static ram (SBSRAM). Due to the prohibitive cost of the high-speed random access memory, coupled with their power volatility, a third lower level of the hierarchy exists for non-volatile mass storage devices. While mass storage devices offer increased capacity and fairly economical data storage, their data storage and retrieval bandwidth is often much less in relation to the other elements of a computing system.

Computers systems represent information in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video, frequently exists in the natural world as analog information. As is well known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

Modern computers utilize digital data representation because of its inherent advantages. For example, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossless and lossy data compression.

Over the last decade, computer processor performance has improved by at least a factor of 50. During this same period, magnetic disk storage has only improved by a factor of 5. Thus one additional problem with the existing art is that memory storage devices severely limit the performance of consumer, entertainment, office, workstation, servers, and mainframe computers for all disk and memory intensive operations.

For example, magnetic disk mass storage devices currently employed in a variety of home, business, and scientific computing applications suffer from significant seek-time access delays along with profound read/write data rate limitations. Currently the fastest available (15,000) rpm disk drives support only a 40.0 Megabyte per second data rate (MB/sec). This is in stark contrast to the modern Personal Computer's Peripheral Component Interconnect (PCI) Bus's input/output capability of 512 MB/sec and internal local bus capability of 1600 MB/sec.

Another problem within the current art is that emergent high performance disk interface standards such as the Small Computer Systems Interface (SCSI-3), iSCSI, Fibre Channel, AT Attachment UltraDMA/100+, Serial Storage Architecture, and Universal Serial Bus offer only higher data transfer rates through intermediate data buffering in random access memory. These interconnect strategies do not address the fundamental problem that all modern magnetic disk storage devices for the personal computer marketplace are still limited by the same typical physical media restriction. In practice, faster disk access data rates are only achieved by the high cost solution of simultaneously accessing multiple disk drives with a technique known within the art as data striping and redundant array of independent disks (RAID).

RAID systems often afford the user the benefit of increased data bandwidth for data storage and retrieval. By simultaneously accessing two or more disk drives, data bandwidth may be increased at a maximum rate that is linear and directly proportional to the number of disks employed. Thus another problem with modern data storage systems utilizing RAID systems is that a linear increase in data bandwidth requires a proportional number of added disk storage devices.

Another problem with most modern mass storage devices is their inherent unreliability. Many modern mass storage devices utilize rotating assemblies and other types of electromechanical components that possess failure rates one or more orders of magnitude higher than equivalent solid state devices. RAID systems employ data redundancy distributed across multiple disks to enhance data storage and retrieval reliability. In the simplest case, data may be explicitly repeated on multiple places on a single disk drive, on multiple places on two or more independent disk drives. More complex techniques are also employed that support various trade-offs between data bandwidth and data reliability.

Standard types of RAID systems currently available include RAID Levels 0, 1, and 5. The configuration selected depends on the goals to be achieved. Specifically data reliability, data validation, data storage/retrieval bandwidth, and cost all play a role in defining the appropriate RAID data storage solution. RAID level 0 entails pure data striping across multiple disk drives. This increases data bandwidth at best linearly with the number of disk drives utilized. Data reliability and validation capability are decreased. A failure of a single drive results in a complete loss of all data. Thus another problem with RAID systems is that low cost improved bandwidth requires a significant decrease in reliability.

RAID Level 1 utilizes disk mirroring where data is duplicated on an independent disk subsystem. Validation of data amongst the two independent drives is possible if the data is simultaneously accessed on both disks and subsequently compared. This tends to decrease data bandwidth from even that of a single comparable disk drive. In systems that offer hot swap capability, the failed drive is removed and a replacement drive is inserted. The data on the failed drive is then copied in the background while the entire system continues to operate in a performance degraded but fully operational mode. Once the data rebuild is complete, normal operation resumes. Hence, another problem with RAID systems is the high cost of increased reliability and associated decrease in performance.

RAID Level 5 employs disk data striping and parity error detection to increase both data bandwidth and reliability simultaneously. A minimum of three disk drives is required for this technique. In the event of a single disk drive failure, that drive may be rebuilt from parity and other data encoded on disk remaining disk drives. In systems that offer hot swap capability, the failed drive is removed and a replacement drive is inserted. The data on the failed drive is then rebuilt in the background while the entire system continues to operate in a performance degraded but fully operational mode. Once the data rebuild is complete, normal operation resumes.

Thus another problem with redundant modern mass storage devices is the degradation of data bandwidth when a storage device fails. Additional problems with bandwidth limitations and reliability similarly occur within the art by all other forms of sequential, pseudo-random, and random access mass storage devices. Typically mass storage devices include magnetic and optical tape, magnetic and optical disks, and various solid-state mass storage devices. It should be noted that the present invention applies to all forms and manners of memory devices including storage devices utilizing magnetic, optical, neural and chemical techniques or any combination thereof.

Yet another problem within the current art is the application and use of various data compression techniques. It is well known within the current art that data compression provides several unique benefits. First, data compression can reduce the time to transmit data by more efficiently utilizing low bandwidth data links. Second, data compression economizes on data storage and allows more information to be stored for a fixed memory size by representing information more efficiently.

For purposes of discussion, data compression is canonically divided into lossy and lossless techniques. Lossy data compression techniques provide for an inexact representation of the original uncompressed data such that the decoded (or reconstructed) data differs from the original unencoded/ uncompressed data. Lossy data compression is also known as irreversible or noisy compression. Negentropy is defined as the quantity of information in a given set of data. Thus, one obvious advantage of lossy data compression is that the compression ratios can be larger than that dictated by the negentropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio of the target display device.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the entropy of a given data set.

A rich and highly diverse set of lossless data compression and decompression algorithms exist within the current art. These range from the simplest "adhoc" approaches to highly sophisticated formalized techniques that span the sciences of information theory, statistics, and artificial intelligence. One fundamental problem with almost all modern approaches is the compression ratio to encoding and decoding speed achieved. As previously stated, the current theoretical limit for data compression is the entropy limit of the data set to be encoded. However, in practice, many factors actually limit the compression ratio achieved. Most modern compression algorithms are highly content dependent. Content dependency exceeds the actual statistics of individual elements and often includes a variety of other factors including their spatial location within the data set.

Of popular compression techniques, arithmetic coding possesses the highest degree of algorithmic effectiveness, and as expected, is the slowest to execute. This is followed in turn by dictionary compression, Huffman coding, and run-length coding with respectively decreasing execute times. What is not apparent from these algorithms, that is also one major deficiency within the current art, is knowledge of their algorithmic efficiency. More specifically, given a compression ratio that is within the effectiveness of multiple algorithms, the question arises as their corresponding efficiency.

Within the current art there also presently exists a strong inverse relationship between achieving the maximum (current) theoretical compression ratio, which we define as algorithmic effectiveness, and requisite processing time. For a given single algorithm the effectiveness over a broad class of data sets including text, graphics, databases, and executable object code is highly dependent upon the processing effort applied. Given a baseline data set, processor operating speed and target architecture, along with its associated supporting memory and peripheral set, we define algorithmic efficiency as the time required to achieve a given compression ratio. Algorithmic efficiency assumes that a given algorithm is implemented in an optimum object code representation executing from the optimum places in memory. This is almost never achieved in practice due to limitations within modern optimizing software compilers. It should be further noted that an optimum algorithmic implementation for a given input data set may not be optimum for a different data set. Much work remains in developing a comprehensive set of metrics for measuring data compression algorithmic performance, however for present purposes the previously defined terms of algorithmic effectiveness and efficiency should suffice.

Various solutions to this problem of optimizing algorithmic implementation are found in U.S. Pat. Nos. 6,195,024 and 6,309,424, issued on Feb. 27, 2001 and Oct. 30, 2001, respectively, to James Fallon, both of which are entitled "Content Independent Data Compression Method and System," and are incorporated herein by reference. These patents describe data compression methods that provide content-independent data compression, wherein an optimal compression ratio for an encoded stream can be achieved regardless of the data content of the input data stream. As more fully described in the above incorporated patents, a data compression protocol comprises applying an input data stream to each of a plurality of different encoders to, in effect, generate a plurality of encoded data streams. The plurality of encoders are preferably selected based on their ability to effectively encode different types of input data. The final compressed data stream is generated by selectively combining blocks of the compressed streams output from the plurality of encoders based on one or more factors such as the optimal compression ratios obtained by the plurality of decoders. The resulting compressed output stream can achieve the greatest possible compression, preferably in real-time, regardless of the data content.

Yet another problem within the current art relates to data management and the use of existing file management systems. Present computer operating systems utilize file management systems to store and retrieve information in a uniform, easily identifiable, format. Files are collections of executable programs and/or various data objects. Files occur in a wide variety of lengths and must be stored within a data storage device. Most storage devices, and in particular, mass storage devices, work most efficiently with specific quantities of data. For example, modern magnetic disks are often divided into cylinders, heads and sectors. This breakout arises from legacy electromechanical considerations with the format of an individual sector often some binary multiple of bytes (512, 1024, . . . ). A fixed or variable quantity of sectors housed on an individual track. The number of sectors permitted on a single track is limited by the number of reliable flux reversals that can be encoded on the storage media per linear inch, often referred to as linear bit density. In disk drives with multiple heads and disk media, a single cylinder is comprised of multiple tracks.

A file allocation table is often used to organize both used and unused space on a mass storage device. Since a file often comprises more than one sector of data, and individual sectors or contiguous strings of sectors may be widely dispersed over multiple tracks and cylinders, a file allocation table provides a methodology of retrieving a file or portion thereof. File allocation tables are usually comprised of strings of pointers or indices that identify where various portions of a file are stored.

In-order to provide greater flexibility in the management of disk storage at the media side of the interface, logical block addresses have been substituted for legacy cylinder, head, sector addressing. This permits the individual disk to optimize its mapping from the logical address space to the physical sectors on the disk drive. Advantages with this technique include faster disk accesses by allowing the disk manufacturer greater flexibility in managing data interleaves and other high-speed access techniques. In addition, the replacement of bad media sectors can take place at the physical level and need not be the concern of the file allocation table or host computer. Furthermore, these bad sector replacement maps are definable on a disk by disk basis.

Practical limitations in the size of the data required to both represent and process an individual data block address, along with the size of individual data blocks, governs the type of file allocation tables currently in use. For example, a 4096 byte logical block size (8 sectors) employed with 32 bit logical block addresses. This yields an addressable data space of 17.59 Terabytes. Smaller logical blocks permit more efficient use of disk space. Larger logical blocks support a larger addressable data space. Thus one limitation within the current art is that disk file allocation tables and associated file management systems are a compromise between efficient data storage, access speed, and addressable data space.

Data in a computer has various levels of information content. Even within a single file, many data types and formats are utilized. Each data representation has specific meaning and each may hold differing quantities of information. Within the current art, computers process data in a native, uncompressed, format. Thus compressed data must often be decompressed prior to performing various data processing functions or operations. Modern file systems have been designed to work with data in its native format. Thus another significant problem within the current art is that file systems are not able to randomly access compressed data in an efficient manner.

Further aggravating this problem is the fact that when data is decompressed, processed and recompressed it may not fit back into its original disk space, causing disk fragmentation or complex disk space reallocation requirements. Several solutions exist within the current art including file by file and block structured compressed data management.

In file by file compression, each file is compressed when stored on disk and decompressed when retrieved. For very small files this technique is often adequate, however for larger files the compression and decompression times are too slow, resulting in inadequate system level performance. In addition, the ability to access randomly access data within a specific file is lost. The one advantage to file by file compression techniques is that they are easy to develop and are compatible with existing file systems. Thus file by file compressed data management is not an adequate solution.

Block structured disk compression operates by compressing and decompressing fixed block sizes of data. Block sizes are often fixed, but may be variable in size. A single file usually is comprised of multiple blocks, however a file may be so small as to fit within a single block. Blocks are grouped together and stored in one or more disk sectors as a group of Blocks (GOBs). A group of blocks is compressed and decompressed as a unit, thus there exists practical limitations on the size of GOBs. Most compression algorithms achieve a higher level of algorithmic effectiveness when operating on larger quantities of data. Restated, the larger the quantity of data processed with a uniform information density, the higher the compressions ratio achieved. If GOBs are small compression ratios are low and processing time short. Conversely, when GOBS are large compression ratios are higher and processing time is longer. Large GOBs tend to perform in a manner analogous to file by file compression. The two obvious benefits to block structured disk compression are psuedo-random data access and reduced data compression/decompression processing time.

Several problems exist within the current art for the management of compressed blocks. One method for storage of compressed files on disk is by contiguously storing all GOBs corresponding to a single file. However as files are processed within the computers, files may grow or shrink in size. Inefficient disk storage results when a substantial file size reduction occurs. Conversely when a file grows substantially, the additional space required to store the data may not be available contiguously. The result of this process is substantial disk fragmentation and slower access times.

An alternate method is to map compressed GOBs into the next logical free space on the disk. One problem with this method is that average file access times are substantially increased by this technique due to the random data storage. Peak access delays may be reduced since the statistics behave with a more uniform white spectral density, however this is not guaranteed.

A further layer of complexity is encountered when compressed information is to be managed on more than one data storage device. Competing requirements of data access bandwidth, data reliability/redundancy, and efficiency of storage space are encountered.

These and other limitations within the current art are solved with the present invention.

SUMMARY OF THE INVENTION

The present invention is directed to a system and method for compressing and decompressing based on the actual or expected throughput (bandwidth) of a system employing data compression and a technique of optimizing based upon planned, expected, predicted, or actual usage.

In one aspect of the present invention, a system for providing bandwidth sensitive data compression comprises:

a data compression system for compressing and decompressing data input to the system;

a plurality of compression routines selectively utilized by the data compression system; and a controller for tracking the throughput of the system and generating a control signal to select a compression routine based on the system throughput. In a preferred embodiment, when the controller determines that the system throughput falls below a predetermined throughput threshold, the controller commands the data compression engine to use a compression routine providing a faster rate of compression so as to increase the throughput.

In another aspect, a system for providing bandwidth sensitive data compression comprises a plurality of access profiles, operatively accessible by the controller that enables the controller to determine a compression routine that is associated with a data type of the data to be compressed. The access profiles comprise information that enables the controller to select a suitable compression algorithm that provides a desired balance between execution speed (rate of compression) and efficiency (compression ratio).

In yet another aspect, a system comprises a data storage controller for controlling the compression and storage of compressed data to a storage device and the retrieval and decompression of compressed data from the storage device. The system throughput tracked by the controller preferably comprises a number of pending access requests to a storage device.

In another aspect, the system comprises a data transmission controller for controlling the compression and transmission of compressed data, as well as the decompression of compressed data received over a communication channel. The system throughput tracked by the controller comprises a number of pending transmission requests over the communication channel.

In yet another aspect of the present invention, a method for providing bandwidth sensitive data compression in a data processing system, comprises the steps of:

compressing data using an first compression routine providing a first compression rate;

tracking the throughput of the data processing system to determine if the first compression rate provides a throughput that meets a predetermined throughput threshold; and compressing data using a second compression routine providing a second compression rate that is greater than the first compression rate, if the tracked throughput does not meet the predetermined throughput threshold.

Preferably, the first compression routine comprises a default asymmetric routine and wherein the second compression routine comprises a symmetric routine.

In another aspect, the method comprises processing a user command to load a user-selected compression routine for compressing data.

In another aspect, the method further comprises processing a user command to compress user-provided data and automatically selecting a compression routine associated with a data type of the user-provided data.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
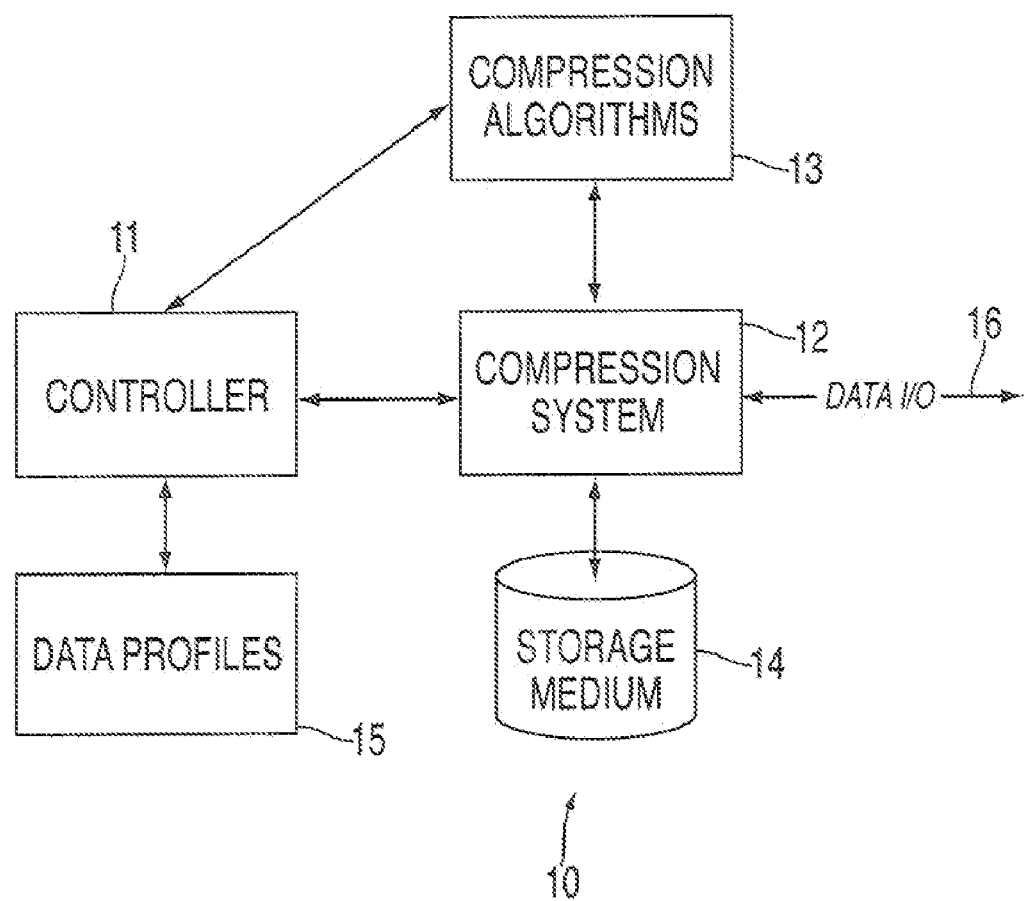
FIG. 1 is a high-level block diagram of a system for providing bandwidth sensitive data compression/decompression according to an embodiment of the present invention.

The present invention is directed to a system and method for compressing and decompressing based on the actual or expected throughput (bandwidth) of a system employing data compression. Although one of ordinary skill in the art could readily envision various implementations for the present invention, a preferred system in which this invention is employed comprises a data storage controller that preferably utilizes a real-time data compression system to provide "accelerated" data storage and retrieval bandwidths. The concept of "accelerated" data storage and retrieval was introduced in co-pending U.S. patent application Ser. No. 09/266,394, filed Mar. 11, 1999, entitled "System and Methods For Accelerated Data Storage and Retrieval" and co-pending U.S. patent application Ser. No. 09/481,243, filed Jan. 11, 2000, entitled "System and Methods For Accelerated Data Storage and Retrieval," both of which are commonly assigned and incorporated herein by reference.

In general, as described in the above-incorporated applications, "accelerated" data storage comprises receiving a digital data stream at a data transmission rate which is greater than the data storage rate of a target storage device, compressing the input stream at a compression rate that increases the effective data storage rate of the target storage device and storing the compressed data in the target storage device. For instance, assume that a mass storage device (such as a hard disk) has a data storage rate of 20 megabytes per second. If a storage controller for the mass storage device is capable of compressing (in real time) an input data stream with an average compression rate of 3:1, then data can be stored in the mass storage device at a rate of 60 megabytes per second, thereby effectively increasing the storage bandwidth ("storewidth") of the mass storage device by a factor of three. Similarly, accelerated data retrieval comprises retrieving a compressed digital data stream from a target storage device at the rate equal to, e.g., the data access rate of the target storage device and then decompressing the compressed data at a rate that increases the effective data access rate of the target storage device. Advantageously, providing accelerated data storage and retrieval at (or close to) real-time can reduce or eliminate traditional bottlenecks associated with, e.g., local and network disk accesses.

In a preferred embodiment, the present invention is implemented for providing accelerated data storage and retrieval. In one embodiment, a controller tracks and monitors the throughput (data storage and retrieval) of a data compression system and generates control signals to enable/disable different compression algorithms when, e.g., a bottleneck occurs so as to increase the throughput and eliminate the bottleneck.

In the following description of preferred embodiments, two categories of compression algorithms are defined—an "asymmetrical" data compression algorithm and a "symmetrical" data compression algorithms. An asymmetrical data compression algorithm is referred to herein as one in which the execution time for the compression and decompression routines differ significantly. In particular, with an asymmetrical algorithm, either the compression routine is slow and the decompression routine is fast or the compression routine is fast and the decompression routine is slow. Examples of asymmetrical compression algorithms include dictionary-based compression schemes such as Lempel-Ziv.

On the other hand, a "symmetrical" data compression algorithm is referred to herein as one in which the execution time for the compression and the decompression routines are substantially similar. Examples of symmetrical algorithms include table-based compression schemes such as Huffman. For asymmetrical algorithms, the total execution time to perform one compress and one decompress of a data set is typically greater than the total execution time of symmetrical algorithms. But an asymmetrical algorithm typically achieves higher compression ratios than a symmetrical algorithm.

It is to be appreciated that in accordance with the present invention, symmetry may be defined in terms of overall effective bandwidth, compression ratio, or time or any combination thereof. In particular, in instances of frequent data read/writes, bandwidth is the optimal parameter for symmetry. In asymmetric applications such as operating systems and programs, the governing factor is net decompression bandwidth, which is a function of both compression speed, which governs data retrieval time, and decompression speed, wherein the total governs the net effective data read bandwidth. These factors work in an analogous manner for data storage where the governing factors are both compression ratio (storage time) and compression speed. The present invention applies to any combination or subset thereof, which is utilized to optimize overall bandwidth, storage space, or any operating point in between.

Referring now to FIG. 1, a high-level block diagram illustrates a system for providing bandwidth sensitive data compression/decompression according to an embodiment of the present invention. In particular, FIG. 1 depicts a host system 10 comprising a controller 11 (e.g., a file management system), a compression/decompression system 12, a plurality of compression algorithms 13, a storage medium 14, and a plurality of data profiles 15. The controller tracks and monitors the throughput (e.g., data storage and retrieval) of the data compression system 12 and generates control signals to enable/disable different compression algorithms 13 when the throughput falls below a predetermined threshold. In one embodiment, the system throughput that is tracked by the controller 11 preferably comprises a number of pending access requests to the memory system.

The compression system 12 is operatively connected to the storage medium 14 using suitable protocols to write and read compressed data to and from the storage medium 14. It is to be understood that the storage medium 14 may comprise any form of memory device including all forms of sequential, pseudo-random, and random access storage devices. The memory storage device 14 may be volatile or non-volatile in nature, or any combination thereof. Storage devices as known within the current art include all forms of random access memory, magnetic and optical tape, magnetic and optical disks, along with various other forms of solid-state mass storage devices. Thus it should be noted that the current invention applies to all forms and manners of memory devices including, but not limited to, storage devices utilizing magnetic, optical, and chemical techniques, or any combination thereof. The data compression system 12 preferably operates in real-time (or substantially real-time) to compress data to be stored on the storage device 14 and to decompress data that is retrieved from the storage device 14. In addition, the compression system 12 may receive data (compressed or not compressed) via an I/O (input/output) port 16 that is transmitted over a transmission line or communication channel from a remote location, and then process such data (e.g., decompress or compress the data). The compression system 12 may further transmit data (compressed or decompressed) via the I/O port 16 to another network device for remote processing or storage.

The controller 11 utilizes information comprising a plurality of data profiles 15 to determine which compression algorithms 13 should be used by the compression system 12. In a preferred embodiment, the compression algorithms 13 comprise one or more asymmetric algorithms. As noted above, with asymmetric algorithms, the compression ratio is typically greater than the compression ratios obtained using symmetrical algorithms. Preferably, a plurality of asymmetric algorithms are selected to provide one or more asymmetric algorithms comprising a slow compress and fast decompress routine, as well as one or more asymmetric algorithms comprising a fast compress and slow decompress routine.

The compression algorithms 14 further comprise one or more symmetric algorithms, each having a compression rate and corresponding decompression rate that is substantially equal. Preferably, a plurality of symmetric algorithms are selected to provide a desired range of compression and decompression rates for data to be processed by a symmetric algorithm.

In a preferred embodiment, the overall throughput (bandwidth) of the system 10 is one factor considered by the controller 11 in deciding whether to use an asymmetrical or symmetrical compression algorithm for processing data stored to, and retrieved from, the storage device 14. Another factor that is used to determine the compression algorithm is the type of data to be processed. In a preferred embodiment, the data profiles 15 comprise information regarding predetermined access profiles of different data sets, which enables the controller 11 to select a suitable compression algorithm based on the data type. For instance, the data profiles may comprise a map that associates different data types (based on, e.g., a file extension) with preferred one(s) of the compression algorithms 13. For example, preferred access profiles considered by the controller 11 are set forth in the following table.

| Access Profile 1: | Access Profile 2 | Access Profile 3 |
|---|---|---|
| Data is written to a storage medium once (or very few times) but is read from the storage medium many times | Data is written to the storage medium often but read few times | The amount of times data is read from and written to the storage medium is substantially the same. |

With Access Profile 1, the decompression routine would be executed significantly more times than the corresponding compression routine. This is typical with operating systems, applications and websites, for example. Indeed, an asymmetrical application can be used to (offline) compress an (OS) operating system, application or Website using a slow compression routine to achieve a high compression ratio. After the compressed OS, application or website is stored, the asymmetric algorithm is then used during runtime to decompress, at a significant rate, the OS, application or website launched or accessed by a user.

Therefore, with data sets falling within Access Profile 1, it is preferable to utilize an asymmetrical algorithm that provides a slow compression routine and a fast decompression routine so as to provide an increase in the overall system performance as compared the performance that would be obtained using a symmetrical algorithm. Further, the compression ratio obtained using the asymmetrical algorithm would likely be higher than that obtained using a symmetrical algorithm (thus effectively increasing the storage capacity of the storage device).

With Access Profile 2, the compression routine would be executed significantly more times than the decompression routine. This is typical with a system for automatically updating an inventory database, for example, wherein an asymmetric algorithm that provides a fast compression routine and a slow decompression routine would provide an overall faster (higher throughput) and efficient (higher compression ratio) system performance than would be obtained using a symmetrical algorithm.

With Access Profile 3, where data is accessed with a similar number of reads and writes, the compression routine would be executed approximately the same number of times as the decompression routine. This is typical of most user-generated data such as documents and spreadsheets. Therefore, it is preferable to utilize a symmetrical algorithm that provides a relatively fast compression and decompression routine. This would result in an overall system performance that would be faster as compared to using an asymmetrical algorithm (although the compression ratio achieved may be lower).

The following table summarizes the three data access profiles and the type of compression algorithm that would produce optimum throughput.

| Access Profile | Example Data Types | Compression Algorithm | Compressed Data Characteristics | Decompression Algorithm |
|---|---|---|---|---|
| 1. Write few, Read many | Operating systems, Programs, Web sites | Asymmetrical (Slow compress) | Very high compression ratio | Asymmetrical (Fast decompress) |
| 2. Write many, Read few | Automatically updated inventory database | Asymmetrical (Fast compress) | Very high compression ratio | Asymmetrical (Slow decompress) |
| 3. Similar number of Reads and Writes | User generated documents | Symmetrical | Standard compression ratio | Symmetrical |

In accordance with the present invention, the access profile of a given data set is known a priori or determined prior to compression so that the optimum category of compression algorithm can be selected. As explained below, the selection process may be performed either manually or automatically by the controller 11 of the data compression system 12. Further, the decision regarding which routines will be used at compression time (write) and at decompression time (read) is preferably made before or at the time of compression. This is because once data is compressed using a certain algorithm, only the matching decompression routine can be used to decompress the data, regardless of how much processing time is available at the time of decompression.

Figure 2:
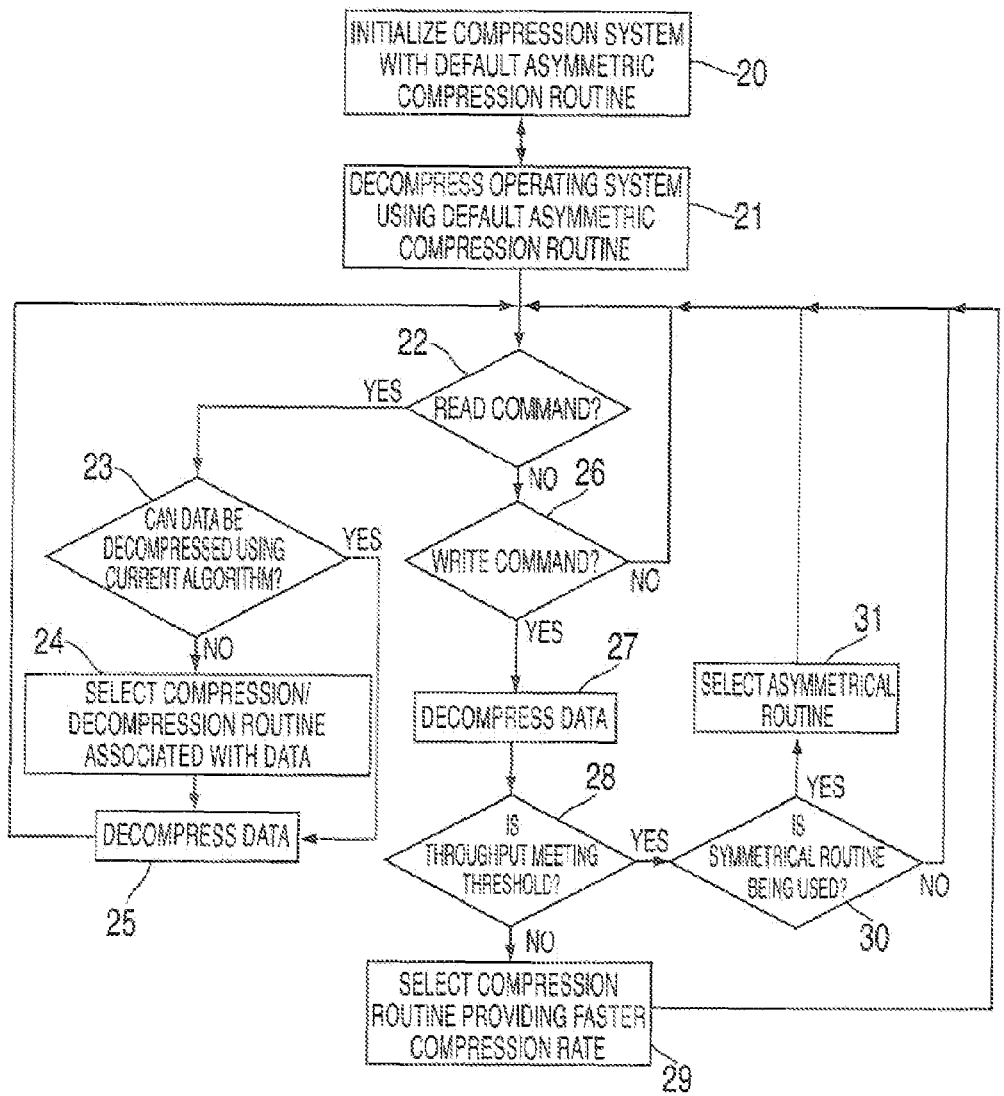
FIG. 2 is a flow diagram of a method for providing bandwidth sensitive data compression/decompression according to one aspect of the present invention.

Referring now to FIG. 2, a flow diagram illustrates a method for providing bandwidth sensitive data compression according to one aspect of the present invention. For purposes of illustration, it is assumed that the method depicted in FIG. 2 is implemented with a disk controller for providing accelerated data storage and retrieval from a hard disk on a PC (personal computer). The data compression system is initialized during a boot-up process after the PC is powered-on and a default compression/decompression routine is instantiated (step 20).

In a preferred embodiment, the default algorithm comprises an asymmetrical algorithm since an operating system and application programs will be read from hard disk memory and decompressed during the initial use of the system 10. Indeed, as discussed above, an asymmetric algorithm that provides slow compression and fast decompression is preferable for compressing operating systems and applications so as to obtain a high compression ratio (to effectively increase the storage capacity of the hard disk) and fast data access (to effectively increase the retrieval rate from the hard disk). The initial asymmetric routine that is applied (by, e.g., a vendor) to compress the operating system and applications is preferably set as the default. The operating system will be retrieved and then decompressed using the default asymmetric routine (step 21).

During initial runtime, the controller will maintain use the default algorithm until certain conditions are met. For instance, if a read command is received (affirmative result in step 22), the controller will determine whether the data to be read from disk can be compressed using the current routine (step 23). For this determination, the controller could, e.g., read a flag value that indicates the algorithm that was used to compress the file. If the data can be decompressed using the current algorithm (affirmative determination in step 23), then the file will be retrieved and decompressed (step 25). On the other hand, if the data cannot be decompressed using the current algorithm (negative determination in step 23), the controller will issue the appropriate control signal to the compression system to load the algorithm associated with the file (step 24) and, subsequently, decompress the file (step 25).

If a write command is received (affirmative result in step 26), the data to be stored will be compressed using the current algorithm (step 27). During the process of compression and storing the compressed data, the controller will track the throughput to determine whether the throughput is meeting a predetermined threshold (step 28). For example, the controller may track the number of pending disk accesses (access requests) to determine whether a bottleneck is occurring. If the throughput of the system is not meeting the desired threshold (e.g., the compression system cannot maintain the required or requested data rates)(negative determination in step 28), then the controller will command the data compression system to utilize a compression routine providing faster compression (e.g., a fast symmetric compression algorithm) (step 29) so as to mitigate or eliminate the bottleneck.

If, on the other hand, the system throughput is meeting or exceeding the threshold (affirmative determination in step 28) and the current algorithm being used is a symmetrical routine (affirmative determination in step 30), in an effort to achieve optimal compression ratios, the controller will command the data compression system to use an asymmetric compression algorithm (step 31) that may provide a slower rate of compression, but provide efficient compression.

This process is repeated such that whenever the controller determines that the compression system can maintain the required/requested data throughput using a slow (highly efficient) asymmetrical compression algorithm, the controller will allow the compression system to operate in the asymmetrical mode. This will allow the system to obtain maximum storage capacity on the disk. Further, the controller will command the compression system to use a symmetric routine comprising a fast compression routine when the desired throughput is not met. This will allow the system to, e.g., service the backlogged disk accesses. Then, when the controller determines that the required/requested data rates are subsequently lower and the compression system can maintain the data rate, the controller can command the compression system to use a slower (but more efficient) asymmetric compression algorithm.

With the above-described method depicted in FIG. 2, the selection of the compression routine is performed automatically by the controller so as to optimize system throughput. In another embodiment, a user that desires to install a program or text files, for example, can command the system (via a software utility) to utilize a desired compression routine for compressing and storing the compressed program or files to disk. For example, for a power user, a GUI menu can be displayed that allows the user to directly select a given algorithm. Alternatively, the system can detect the type of data being installed or stored to disk (via file extension, etc.) and automatically select an appropriate algorithm using the Access Profile information as described above. For instance, the user could indicate to the controller that the data being installed comprises an application program which the controller would determine falls under Access Profile 1. The controller would then command the compression engine to utilize an asymmetric compression algorithm employing a slow compression routine and a fast decompression routine. The result would be a one-time penalty during program installation (slow compression), but with fast access to the data on all subsequent executions (reads) of the program, as well as a high compression ratio.

It is to be appreciated that the present invention may be implemented in any data processing system, device, or apparatus using data compression. For instance, the present invention may be employed in a data transmission controller in a network environment to provide accelerated data transmission over a communication channel (i.e., effectively increase the transmission bandwidth by compressing the data at the source and decompressing data at the receiver, in real-time).

Further, the present invention can be implemented with a data storage controller utilizing data compression and decompression to provided accelerated data storage and retrieval from a mass storage device. Exemplary embodiments of preferred data storage controllers in which the present invention may be implemented are described, for example, in U.S. patent application Ser. No. 09/775,905, filed on Feb. 2, 2001, entitled "Data Storewidth Accelerator", which is commonly assigned and fully incorporated herein by reference.

Figure 3:
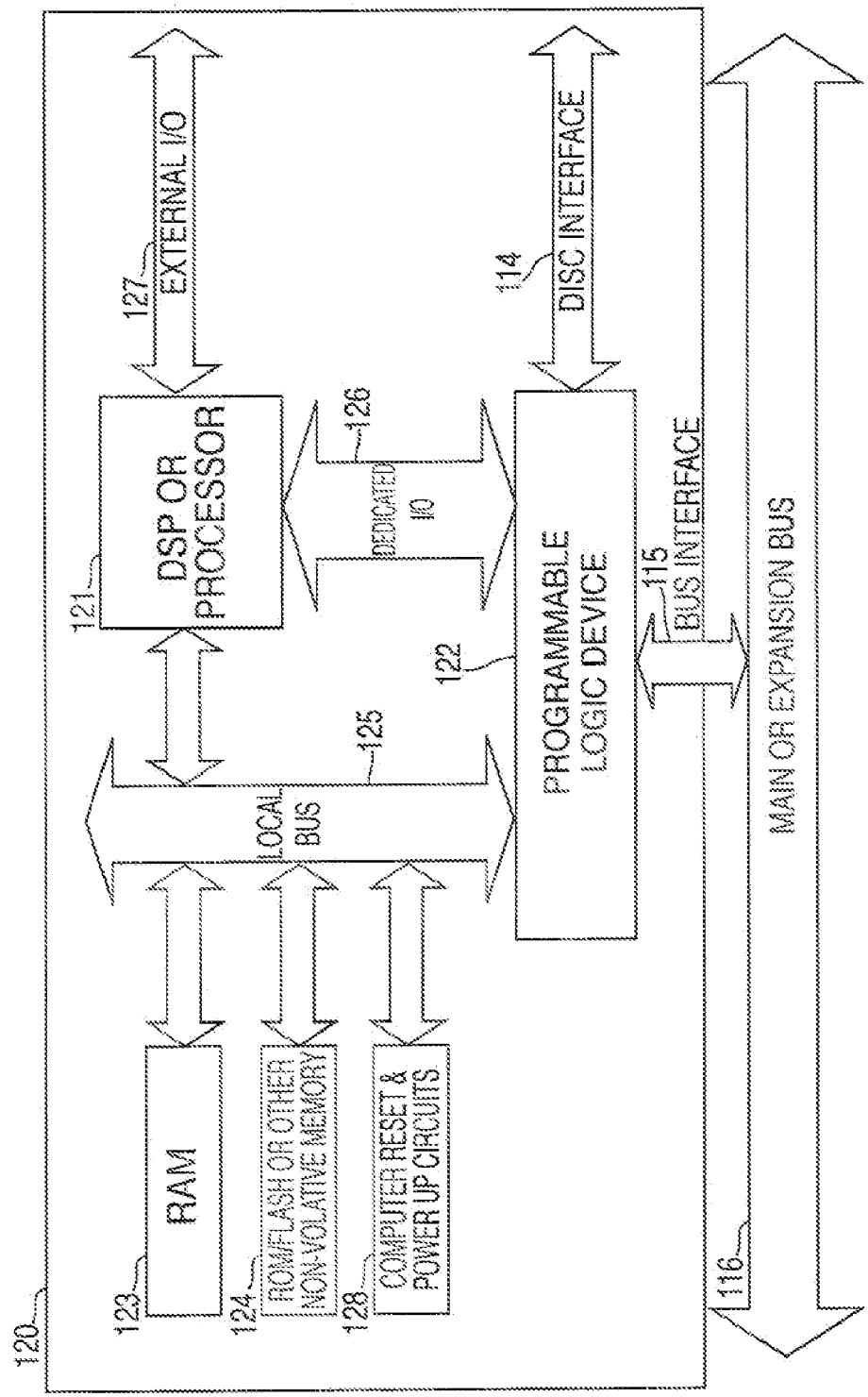
FIG. 3 is a block diagram of a preferred system for implementing a bandwidth sensitive data compression/decompression method according to an embodiment of the present invention.

FIG. 3 illustrates a preferred embodiment of a data storage controller 120 as described in the above-incorporated U.S. Ser. No. 09/775,905 for implementing a bandwidth sensitive data compression protocol as described herein. The storage controller 120 comprises a DSP (digital signal processor) 121 (or any other micro-processor device) that implements a data compression/decompression routine. The DSP 121 preferably employs a plurality of symmetric and asymmetric compression/decompression as described herein. The data storage controller 120 further comprises at least one programmable logic device 122 (or volatile logic device). The programmable logic device 122 preferably implements the logic (program code) for instantiating and driving both a disk interface 114 and a bus interface 115 and for providing full DMA (direct memory access) capability for the disk and bus interfaces 114, 115. Further, upon host computer power-up and/or assertion of a system-level "reset" (e.g., PCI Bus reset), the DSP 121 initializes and programs the programmable logic device 122 before of the completion of initialization of the host computer. This advantageously allows the data storage controller 120 to be ready to accept and process commands from the host computer (via the bus 116) and retrieve boot data from the disk (assuming the data storage controller 120 is implemented as the boot device and the hard disk stores the boot data (e.g., operating system, etc.))

The data storage controller 120 further comprises a plurality of memory devices including a RAM (random access memory) device 123 and a ROM (read only memory) device 124 (or FLASH memory or other types of non-volatile memory). The RAM device 123 is utilized as on-board cache and is preferably implemented as SDRAM. The ROM device 124 is utilized for non-volatile storage of logic code associated with the DSP 121 and configuration data used by the DSP 121 to program the programmable logic device 122.

The DSP 121 is operatively connected to the memory devices 123, 124 and the programmable logic device 122 via a local bus 125. The DSP 121 is also operatively connected to the programmable logic device 122 via an independent control bus 126. The programmable logic device 122 provides data flow control between the DSP 121 and the host computer system attached to the bus 116, as well as data flow control between the DSP 121 and the storage device. A plurality of external I/O ports 127 are included for data transmission and/or loading of one or more programmable logic devices. Preferably, the disk interface 114 driven by the programmable logic device 122 supports a plurality of hard drives.

The storage controller 120 further comprises computer reset and power up circuitry 128 (or "boot configuration circuit") for controlling initialization (either cold or warm boots) of the host computer system and storage controller 120. A preferred boot configuration circuit and preferred computer initialization systems and protocols are described in U.S. patent application Ser. No. 09/775,897, filed on Feb. 2, 2001, entitled "System and Methods For Computer Initialization," which is commonly assigned and incorporated herein by reference. Preferably, the boot configuration circuit 128 is employed for controlling the initializing and programming the programmable logic device 122 during configuration of the host computer system (i.e., while the CPU of the host is held in reset). The boot configuration circuit 128 ensures that the programmable logic device 122 (and possibly other volatile or partially volatile logic devices) is initialized and programmed before the bus 116 (such as a PCI bus) is fully reset. In particular, when power is first applied to the boot configuration circuit 128, the boot configuration circuit 28 generates a control signal to reset the local system (e.g., storage controller 120) devices such as a DSP, memory, and I/O interfaces. Once the local system is powered-up and reset, the controlling device (such as the DSP 121) will then proceed to automatically determine the system environment and configure the local system to work within that environment. By way of example, the DSP 121 of the disk storage controller 120 would sense that the data storage controller 120 is on a PCI computer bus (expansion bus) and has attached to it a hard disk on an IDE interface. The DSP 121 would then load the appropriate PCI and IDE interfaces into the programmable logic device 122 prior to completion of the host system reset. Once the programmable logic device 122 is configured for its environment, the boot device controller is reset and ready to accept commands over the computer/expansion bus 116.

It is to be understood that the data storage controller 120 may be utilized as a controller for transmitting data (compressed or uncompressed) to and from remote locations over the DSP I/O ports 127 or system bus 116, for example. Indeed, the I/O ports 127 of the DSP 121 may be used for transmitting data (compressed or uncompressed) that is either retrieved from the disk or received from the host system via the bus 116, to remote locations for processing and/or storage. Indeed, the I/O ports may be operatively connected to other data storage controllers or to a network communication channels. Likewise, the data storage controller 120 may receive data (compressed or uncompressed) over the I/O ports 127 of the DSP 121 from remote systems that are connected to the I/O ports 127 of the DSP, for local processing by the data storage controller 120. For instance, a remote system may remotely access the data storage controller 120 (via the I/O ports of the DSP or system bus 116) to utilize the data compression, in which case the data storage controller 120 would transmit the compressed data back to the system that requested compression.

In accordance with the present invention, the system (e.g., data storage controller 120) preferably boots-up in a mode using asymmetrical data compression. It is to be understood that the boot process would not be affected whether the system boots up defaulting to an asymmetrical mode or to a symmetrical mode. This is because during the boot process of the computer, it is reading the operating system from the disk, not writing. However, once data is written to the disk using a compression algorithm, it must retrieve and read the data using the corresponding decompression algorithm.

As the user creates, deletes and edits files, the disk controller 120 will preferably utilize an asymmetrical compression routine that provides slow compression and fast decompression. Since using the asymmetrical compression algorithm will provide slower compression than a symmetrical algorithm, the file system of the computer will track whether the disk controller 120 has disk accesses pending. If the disk controller 120 does have disk accesses pending and the system is starting to slow down, the file management system will command the disk controller 120 to use a faster symmetrical compression algorithm. If there are no disk access requests pending, the file management system will leave the disk controller in the mode of using the asymmetrical compression algorithm.

If the disk controller 120 was switched to using a symmetrical algorithm, the file management system will preferably signal the controller to switch back to a default asymmetrical algorithm when, e.g., the rate of the disk access requests slow to the point where there are no pending disk accesses.

At some point a user may decide to install software or load files onto the hard disk. Before installing the software, for example, as described above, the user could indicate to the disk controller 120 (via a software utility) to enter and remain in an asymmetric mode using an asymmetric compression algorithm with a slow compression routine and a very fast decompression routine. The disk controller would continue to use the asymmetrical algorithm until commanded otherwise, regardless of the number of pending disk accesses. Then, after completing the software installation, the user would then release the disk controller from this "asymmetrical only" mode of operation (via the software utility).

Again, when the user is not commanding the disk controller 120 to remain in a certain mode, the file management system will determine whether the disk controller should use the asymmetrical compression algorithms or the symmetrical compression algorithms based on the amount of backlogged disk activity. If the backlogged disk activity exceeds a threshold, then the file management system will preferably command the disk controller to use a faster compression algorithm, even though compression performance may suffer. Otherwise, the file management system will command the disk controller to use the asymmetrical algorithm that will yield greater compression performance.

It is to be appreciated that the data compression methods described herein by be integrated or otherwise implemented with the content independent data compression methods described in the above-incorporated U.S. Pat. Nos. 6,195,024 and 6,309,424.

Figures 4A, 4B:
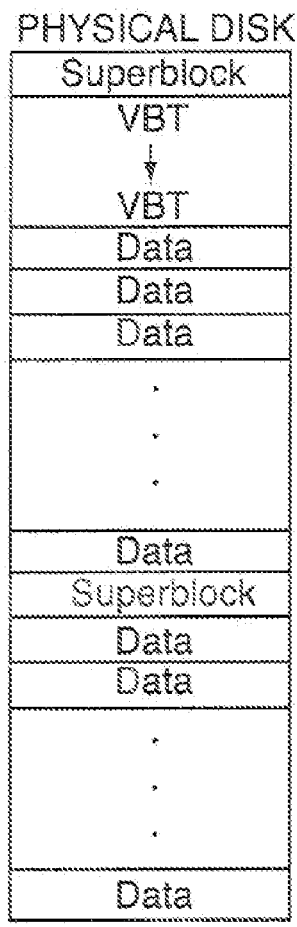
FIG. 4a is a diagram of a file system format of a virtual and/or physical disk according to an embodiment of the present invention.
FIG. 4b is a diagram of a data structure of a sector map entry of a virtual block table according to an embodiment of the present invention.

In yet another embodiment of the present invention a virtual file management system is utilized to store, retrieve, or transmit compressed and/or accelerated data. In one embodiment of the present invention, a physical or virtual disk is utilized employing a representative file system format as illustrated in FIG. 4. As shown in FIG. 4, a virtual file system format comprises one or more data items. For instance, a "Superblock" denotes a grouping of configuration information necessary for the operation of the disk management system. The Superblock typically resides in the first sector of the disk. Additional copies of the Superblock are preferably maintained on the disk for backup purposes. The number of copies will depend on the size of the disk. One sector is preferably allocated for each copy of the Superblock on the disk, which allows storage to add additional parameters for various applications. The Superblock preferably comprises information such as (i) compress size; (ii) virtual block table address; (iii) virtual block table size; (iv) allocation size; (v) number of free sectors (approximate); (vi) ID ("Magic") number; and (vii) checksum The "compress size" refers to the maximum uncompressed size of data that is grouped together for compression (referred to as a "data chunk"). For example, if the compress size is set to 16 k and a 40 k data block is sent to the disk controller for storage, it would be divided into two 16 k chunks and one 8 k chunk. Each chunk would be compressed separately and possess it's own header. As noted above, for many compression algorithms, increasing the compression size will increase the compression ratio obtained. However, even when a single byte is needed from a compressed data chunk, the entire chunk must be decompressed, which is a tradeoff with respect to using a very large compression size.

The "virtual block table address" denotes the physical address of the virtual block table. The "virtual block table size" denotes the size of the virtual block table.

The "allocation size" refers to the minimum number of contiguous sectors on the disk to reserve for each new data entry. For example, assuming that 4 sectors are allowed for each allocation and that a compressed data entry requires only 1 sector, then the remaining 3 sectors would be left unused. Then, if that piece of data were to be appended, there would be room to increase the data while remaining contiguous on the disk. Indeed, by maintaining the data contiguously, the speed at which the disk can read and write the data will increase. Although the controller preferably attempts to keep these unused sectors available for expansion of the data, if the disk were to fill up, the controller could use such sectors to store new data entries. In this way, a system can be configured to achieve greater speed, while not sacrificing disk space. Setting the allocation size to 1 sector would effectively disable this feature.

The "number Of free sectors" denotes the number of physical free sectors remaining on the disk. The ID ("Magic) number" identifies this data as a Superblock. The "checksum" comprises a number that changes based on the data in the Superblock and is used for error checking. Preferably, this number is chosen so that all of the words in the Superblock (including the checksum) added up are equal to zero.

The "virtual block table" (VBT) comprises a number of "sector map" entries, one for each grouping of compressed data (or chunks). The VBT may reside anywhere on the disk. The size of the VBT will depend on how much data is on the disk. Each sector map entry comprises 8 bytes. Although there is preferably only one VBT on the disk, each chunk of compressed data will have a copy of its sector map entry in its header. If the VBT were to become corrupted, scanning the disk for all sector maps could create a new one.

The term "type" refers to the sector map type. For example, a value of "00" corresponds to this sector map definition. Other values are preferably reserved for future redefinitions of the sector map.

A "C Type" denotes a compression type. A value of "000" will correspond to no compression. Other values are defined as required depending on the application. This function supports the use of multiple compression algorithms along with the use of various forms of asymmetric data compression.

The "C Info" comprises the compression information needed for the given compression type. These values are defined depending on the application. In addition, the data may be tagged based on it's use—for example operating system "00", Program "01", or data "10". Frequency of use or access codes may also be included. The size of this field may be greatly expanded to encode statistics supporting these items including, for example, cumulative number of times accessed, number of times accessed within a given time period or CPU clock cycles, and other related data.

The "sector count" comprises the number of physical sectors on the disk that are used for this chunk of compressed data. The "LBA" refers to the logical block address, or physical disk address, for this chunk of compressed data.

Referring back to FIG. 4a, each "Data" block represent each data chunk comprising a header and compressed data. The data chunk may up anywhere from 1 to 256 sectors on the disk. Each compressed chunk of data is preferably preceded on the disk by a data block header that preferably comprises the following information: (i) sector map; (ii) VBI; (iii) ID ("Magic") Number; and (iv) checksum.

The "sector map" comprises a copy of the sector map entry in the VBT for this data chunk. The "VBI" is the Virtual Block Index, which is the index into the VBT that corresponds to this data chunk. The "ID ("Magic) Number" identifies this data as a data block header. The "checksum" number will change based on the data in the header and is used for error checking. This number is preferably chosen such that the addition of all the words in the header (including the checksum) will equal zero.

It should be noted that the present invention is not limited to checksums but may employ any manner of error detection and correction techniques, utilizing greatly expanded fields error detection and/or correction.

It should be further noted that additional fields may be employed to support encryption, specifically an identifier for encrypted or unencrypted data along with any parameters necessary for routing or processing the data to an appropriate decryption module or user.

The virtual size of the disk will depend on the physical size of the disk, the compress size selected, and the expected compression ratio. For example, assume there is a 75 GB disk with a selected compress size expecting a 3:1 compression ratio, the virtual disk size would be 225 GB. This will be the maximum amount of uncompressed data that the file system will be able to store on the disk.

If the number chosen is too small, then the entire disk will not be utilized. Consider the above example where a system comprises a 75 GB disk and a 225 GB virtual size. Assume that in actuality during operation the average compression ratio obtained is 5:1. Whereas this could theoretically allow 375 GB to be stored on the 75 GB disk, in practice, only 225 GB would be able to be stored on the disk before a "disk full" message is received. Indeed, with a 5:1 compression ratio, the 225 GB of data would only take up 45 GB on the disk leaving 30 GB unused. Since the operating system would think the disk is full, it would not attempt to write any more information to the disk.

On the other hand, if the number chosen is too large, then the disk will fill up when the operating system would still indicate that there was space available on the disk. Again consider the above example where a system comprises a 75 GB disk and a 225 GB virtual size. Assume further that during operation, the average compression ratio actually obtained is only 2:1. In this case, the physical disk would be full after writing 150 GB to it, but the operating system would still think there is 75 GB remaining. If the operating system tried to write more information to the disk, an error would occur.

Thus, in another embodiment of the present invention, the virtual size of the disk is dynamically altered based upon the achieved compression ratio. In one embodiment, a running average may be utilized to reallocate the virtual disk size. Alternatively, certain portions of the ratios may already be known—such as a preinstalled operating system and programs. Thus, this ratio is utilized for that portion of the disk, and predictive techniques are utilized for the balance of the disk or disks.

Yet in another embodiment, users are prompted for setup information and the computer selects the appropriate virtual disk(s) size or selects the best method of estimation based on, e.g., a high level menu of what is the purpose of this computer: home, home office, business, server. Another submenu may ask for the expected data mix, word, excel, video, music, etc. Then, based upon expected usage and associated compression ratios (or the use of already compressed data in the event of certain forms of music and video) the results are utilized to set the virtual disk size.

It should be noted that the present invention is independent of the number or types of physical or virtual disks, and indeed may be utilized with any type of storage.

It is to be understood that the systems and methods described herein may be implemented in various forms of hardware, software, firmware, special purpose processors, or a combination thereof. In particular, the present invention may be implemented as an application comprising program instructions that are tangibly embodied on a program storage device (e.g., magnetic floppy disk, RAM, ROM, CD ROM, etc.) and executable by any device or machine comprising suitable architecture. It is to be further understood that, because some of the constituent system components and process steps depicted in the accompanying Figures are preferably implemented in software, the actual connections between such components and steps may differ depending upon the manner in which the present invention is programmed. Given the teachings herein, one of ordinary skill in the related art will be able to contemplate these and similar implementations or configurations of the present invention.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method comprising:
compressing data using a first compression routine providing a first compression rate, wherein the first compression routine comprises a first compression algorithm;
tracking the throughput of a data processing system to determine if the first compression rate provides a throughput that meets a predetermined throughput threshold, wherein said tracking throughput comprises tracking a number of pending requests for data transmission; and
when the tracked throughput does not meet the predetermined throughput threshold, compressing data using a second compression routine providing a second compression rate that is greater than the first compression rate, to increase the throughput of the data processing system to at least the predetermined throughput level, wherein the second compression routine comprises a second compression algorithm.

2. The method of claim 1, wherein the second compression routine comprises a symmetric routine.

3. The method of claim 1, wherein said data compressed using said first compression routine comprises a website.

4. The method of claim 1, wherein said data compressed using said first compression routine comprises a music and video.

5. A method comprising:
compressing data using a first compression routine providing a first compression rate;
tracking the throughput of a data processing system to determine if the first compression rate provides a throughput that meets a predetermined throughput threshold; and
when the tracked throughput does not meet the predetermined throughput threshold, compressing data using a second compression routine providing a second compression rate that is greater than the first compression rate, to increase the throughput of the data processing system to at least the predetermined throughput level, wherein the first compression routine comprises an asymmetric routine and wherein the second compression routine comprises a symmetric routine.

6. The method of claim 5, wherein said data compressed using said first compression routine comprises a website.

7. The method of claim 5, wherein said data compressed using said first compression routine comprises a music and video.

8. A method comprising:
compressing data using a first compression routine providing a first compression rate;
tracking the throughput of a data processing system to determine if the first compression rate provides a throughput that meets a predetermined throughput threshold, wherein said tracking throughput comprises tracking a number of pending requests for data transmission; and when the tracked throughput does not meet the predetermined throughput threshold, compressing data using a second compression routine providing a second compression rate that is greater than the first compression rate, to increase the throughput of the data processing system to at least the predetermined throughput level; and utilizing the second routine to perform compression until the throughput of the data processing system is determined to meet the predetermined throughput threshold, and then reusing the first compression routine.

9. The method of claim 8, wherein said data compressed using said first compression routine comprises a website.

10. The method of claim 8, wherein said data compressed using said first compression routine comprises a music and video.

11. A method comprising:

compressing data using a first compression routine providing a first compression rate;

tracking the throughput of a data processing system to determine if the first compression rate provides a throughput that meets a predetermined throughput threshold; and when the tracked throughput does not meet the predetermined throughput threshold, compressing data using a second compression routine providing a second compression rate that is greater than the first compression rate, to increase the throughput of the data processing system to at least the predetermined throughput level; and utilizing the second routine to perform compression until the throughput of the data processing system is determined to meet the predetermined throughput threshold, and then reusing the first compression routine, wherein the first compression routine comprises a default asymmetrical algorithm.

12. The method of claim 11, wherein said data compressed using said first compression routine comprises a website.

13. The method of claim 11, wherein said data compressed using said first compression routine comprises a music and video.

14. A method comprising:

compressing data using a first compression routine providing a first compression rate;

tracking the throughput of a data processing system to determine if the first compression rate provides a throughput that meets a predetermined throughput threshold; and when the tracked throughput does not meet the predetermined throughput threshold, compressing data using a second compression routine providing a second compression rate that is greater than the first compression rate, to increase the throughput of the data processing system to at least the predetermined throughput level; and processing a user command to load a user-selected compression routine for compressing data.

15. The method of claim 14, wherein said data compressed using said first compression routine comprises a website.

16. The method of claim 14, wherein said data compressed using said first compression routine comprises a music and video.

17. A method comprising:

compressing data using a first compression routine providing a first compression rate;

tracking the throughput of a data processing system to determine if the first compression rate provides a throughput that meets a predetermined throughput threshold; and when the tracked throughput does not meet the predetermined throughput threshold, compressing data using a second compression routine providing a second compression rate that is greater than the first compression rate, to increase the throughput of the data processing system to at least the predetermined throughput level;

processing a user command to compress user-provided data; and automatically selecting a compression routine associated with a data type of the user-provided data.

18. A method comprising:

compressing data using a first compression routine providing a first compression rate;

tracking the throughput of a data processing system to determine if the first compression rate provides a throughput that meets a predetermined throughput threshold; and when the tracked throughput does not meet the predetermined throughput threshold, compressing data using a second compression routine providing a second compression rate that is greater than the first compression rate, to increase the throughput of the data processing system to at least the predetermined throughput level, wherein said tracking throughput comprises tracking a number of pending access requests to a storage device.

19. A method comprising:

compressing data using a first compression routine providing a first compression rate;

tracking the throughput of a data processing system to determine if the first compression rate provides a throughput that meets a predetermined throughput threshold; and when the tracked throughput does not meet the predetermined throughput threshold, compressing data using a second compression routine providing a second compression rate that is greater than the first compression rate, to increase the throughput of the data processing system to at least the predetermined throughput level, wherein said tracking throughput comprises tracking a number of pending requests for data transmission over a communication channel.

20. The method of claim 19, wherein said data compressed using said first compression routine comprises a website.

21. The method of claim 19, wherein said data compressed using said first compression routine comprises a music and video.

22. A method comprising:

receiving a digital data stream at an input data transmission rate that is greater than a data storage rate of a target storage device;

compressing the digital data stream at a compression rate that increases the effective data storage rate of the target storage device, wherein the compression rate is at least equal to the ratio of the input data transmission rate to the data storage rate so as to provide continuous storage of the input digital data stream at the input data transmission rate; and storing the compressed digital data stream in the target storage device;

wherein said compressing comprises:
  compressing data using a first compression routine providing a first compression rate, wherein the first compression routine comprises a first compression algorithm;
  tracking an amount of pending access requests to the storage device to determine if the first compression rate provides a throughput that meets a predetermined throughput threshold; and
  compressing data using a second compression routine providing a second compression rate that is greater than the first compression rate, if the tracked throughput does not meet the predetermined throughput threshold, wherein the second compression routine comprises a second compression algorithm.

23. A system comprising:
a data compression system for compressing and decompressing data input;
a plurality of compression routines selectively utilized by the data compression system, wherein a first one of the plurality of compression routines includes a first compression algorithm and a second one of the plurality of compression routines includes a second compression algorithm; and
a controller for tracking throughput and generating a control signal to select a compression routine based on the throughput, wherein said tracking throughput comprises tracking a number of pending requests for data transmission; and
wherein when the controller determines that the throughput falls below a predetermined throughput threshold, the controller commands the data compression engine to use one of the plurality of compression routines to provide a faster rate of compression so as to increase the throughput.

24. A system comprising:
a data compression system for compressing and decompressing data input;
a plurality of compression routines selectively utilized by the data compression system;
a controller for tracking throughput and generating a control signal to select a compression routine based on the throughput,
wherein when the controller determines that the throughput falls below a predetermined throughput threshold, the controller commands the data compression engine to use one of the plurality of compression routines to provide a faster rate of compression so as to increase the throughput; and
a plurality of access profiles, operatively accessible by the controller, to determine a compression routine that is associated with a data type of data to be compressed.

25. A system comprising:
a data compression system for compressing and decompressing data input;
a plurality of compression routines selectively utilized by the data compression system;
a controller for tracking throughput and generating a control signal to select a compression routine based on the throughput,
wherein when the controller determines that the throughput falls below a predetermined throughput threshold, the controller commands the data compression engine to use one of the plurality of compression routines to provide a faster rate of compression so as to increase the throughput, wherein the system comprises a data storage controller, wherein the system throughput comprises a number of pending access requests to a storage device.

26. A system comprising:
a data compression system for compressing and decompressing data input;
a plurality of compression routines selectively utilized by the data compression system;
a controller for tracking throughput and generating a control signal to select a compression routine based on the throughput,
wherein when the controller determines that the throughput falls below a predetermined throughput threshold, the controller commands the data compression engine to use one of the plurality of compression routines to provide a faster rate of compression so as to increase the throughput, wherein the system comprises a data transmission controller, wherein the system throughput comprises a number of pending transmission requests over a communication channel.

27. A program storage device readable by a machine, tangibly embodying a program instructions executable by the machine to perform the method comprising:
  compressing data using a first compression routine providing a first compression rate, wherein the first compression routine comprises a first compression algorithm;
  tracking the throughput of a data processing system to determine if the first compression rate provides a throughput that meets a predetermined throughput threshold, wherein said tracking throughput comprises tracking a number of pending request for data transmission; and
  when the tracked throughput does not meet the predetermined throughput threshold, compressing data using a second compression routine providing a second compression rate that is greater than the first compression rate, to increase the throughput of the data processing system to at least the predetermined throughput level, wherein the second compression routine comprises a second compression algorithm.

28. A program storage device readable by a machine, tangibly embodying a program instructions executable by the machine to perform the method comprising:
  receiving a digital data stream at an input data transmission rate that is greater than a data storage rate of a target storage device;
  compressing the digital data stream at a compression rate that increases the effective data storage rate of the target storage device, wherein the compression rate is at least equal to the ratio of the input data transmission rate to the data storage rate so as to provide continuous storage of the input digital data stream at the input data transmission rate; and
  storing the compressed digital data stream in the target storage device;
  wherein said compressing comprises:
    compressing data using a first compression routine providing a first compression rate, wherein the first compression routine comprises a first compression algorithm;
    tracking an amount of pending access requests to the storage device to determine if the first compression rate provides a throughput that meets a predetermined throughput threshold; and
    compressing data using a second compression routine providing a second compression rate that is greater than the first compression rate, if the tracked throughput does not meet the predetermined throughput threshold, wherein the second compression routine comprises a second compression algorithm.

29. A method comprising:
using a first compression algorithm to compress data at a first compression rate to provide first compressed data to a communications channel;
tracking the throughput of the communications channel, wherein said tracking throughput comprises tracking a number of pending requests for data transmission over said communications channel;
determining if the first compression rate provides throughput that meets a predetermined throughput threshold; and
when the tracked throughput does not meet the predetermined throughput threshold, using a second compression algorithm to compress data at a second compression rate to provide second compressed data to the communications channel, wherein the second compression rate is greater than the first compression rate and providing the second compressed data to the communications channel increases the throughput of the communications channel.

30. The method of claim 29, wherein the communications channel is a network communications channel.

31. The method of claim 29, wherein a receiving device receives the first and second compressed data, and the receiving device decompresses the first and second compressed data.

32. The method of claim 29, wherein the communications channel is a network communications channel, a receiving device receives the first and second compressed data, and the receiving device decompresses the first and second compressed data.

33. The method of claim 29, wherein the second compression algorithm comprises a symmetric algorithm.

34. A method comprising:
compressing data using a first compression routine providing a first compression rate, wherein the first compression routine comprises a first compression algorithm;
tracking the throughput of a data processing system to determine if the first compression rate provides a throughput that meets a predetermined throughput threshold; and
when the tracked throughput does not meet the predetermined throughput threshold, compressing data using a second compression routine providing a second compression rate that is greater than the first compression rate, to increase the throughput of the data processing system to at least the predetermined throughput level, wherein the second compression routine comprises a second compression algorithm, wherein the first compression routine comprises an asymmetric routine.

35. A method comprising:
using a first compression algorithm to compress data at a first compression rate to provide first compressed data to a communications channel;
tracking the throughput of the communications channel;
determining if the first compression rate provides throughput that meets a predetermined throughput threshold; and
when the tracked throughput does not meet the predetermined throughput threshold, using a second compression algorithm to compress data at a second compression rate to provide second compressed data to the communications channel, wherein the second compression rate is greater than the first compression rate and providing the second compressed data to the communications channel increases the throughput of the communications channel, wherein the first compression algorithm comprises an asymmetric algorithm.

36. A method comprising:
using a first compression algorithm to compress data at a first compression rate to provide first compressed data to a communications channel;
tracking the throughput of the communications channel;
determining if the first compression rate provides throughput that meets a predetermined throughput threshold; and
when the tracked throughput does not meet the predetermined throughput threshold, using a second compression algorithm to compress data at a second compression rate to provide second compressed data to the communications channel, wherein the second compression rate is greater than the first compression rate and providing the second compressed data to the communications channel increases the throughput of the communications channel, wherein the first compression algorithm comprises an asymmetric algorithm and the second compression algorithm comprises a symmetric algorithm.

37. A method comprising:
receiving a digital data stream at an input data transmission rate that is greater than a data storage rate of a target storage device;
compressing the digital data stream at a compression rate that increases the effective data storage rate of the target storage device; and
storing the compressed digital data stream in the target storage device,
wherein said compressing comprises:
compressing data using a first compression routine providing a first compression rate, wherein the first compression routine comprises a first compression algorithm;
tracking an amount of pending access requests to the storage device to determine if the first compression rate provides a throughput that meets a predetermined throughput threshold; and
compressing data using a second compression routine providing a second compression rate that is greater than the first compression rate, if the tracked throughput does not meet the predetermined throughput threshold, wherein the second compression routine comprises a second compression algorithm.

38. A method comprising:
compressing data using a first compression routine providing a first compression rate, wherein the first compression routine comprises a first compression algorithm;
tracking the throughput of a data processing system to determine if the first compression rate provides a throughput that meets a predetermined throughput threshold, wherein said tracking throughput comprises tracking a number of pending access requests to a storage device; and
when the tracked throughput does not meet the predetermined throughput threshold, compressing data using a second compression routine providing a second compression rate that is greater than the first compression rate, to increase the throughput of the data processing system to at least the predetermined throughput level, wherein the second compression routine comprises a second compression algorithm.

39. A method comprising:

compressing data using a first compression routine providing a first compression rate;

tracking the throughput of a data processing system to determine if the first compression rate provides a throughput that meets a predetermined throughput threshold, wherein said tracking throughput comprises tracking a number of pending access requests to a storage device; and when the tracked throughput does not meet the predetermined throughput threshold, compressing data using a second compression routine providing a second compression rate that is greater than the first compression rate, to increase the throughput of the data processing system to at least the predetermined throughput level; and utilizing the second routine to perform compression until the throughput of the data processing system is determined to meet the predetermined throughput threshold, and then reusing the first compression routine.

40. A system comprising:

a data compression system for compressing and decompressing data input;

a plurality of compression routines selectively utilized by the data compression system, wherein a first one of the plurality of compression routines includes a first compression algorithm and a second one of the plurality of compression routines includes a second compression algorithm; and a controller for tracking throughput and generating a control signal to select a compression routine based on the throughput, wherein said tracking throughput comprises tracking a number of pending access requests to a storage device; and wherein when the controller determines that the throughput falls below a predetermined throughput threshold, the controller commands the data compression engine to use one of the plurality of compression routines to provide a faster rate of compression so as to increase the throughput.

41. A program storage device readable by a machine, tangibly embodying a program instructions executable by the machine to perform the method comprising:

compressing data using a first compression routine providing a first compression rate, wherein the first compression routine comprises a first compression algorithm;

tracking the throughput of a data processing system to determine if the first compression rate provides a throughput that meets a predetermined throughput threshold, wherein said tracking throughput comprises tracking a number of pending access requests to a storage device; and when the tracked throughput does not meet the predetermined throughput threshold, compressing data using a second compression routine providing a second compression rate that is greater than the first compression rate, to increase the throughput of the data processing system to at least the predetermined throughput level, wherein the second compression routine comprises a second compression algorithm.

* * * * *